(12) United States Patent
Mandegaran et al.

(10) Patent No.: US 7,321,242 B2
(45) Date of Patent: Jan. 22, 2008

(54) INTEGRATED CIRCUIT WITH BREAKDOWN VOLTAGE MULTIPLIER

(75) Inventors: Sam Mandegaran, Tustin, CA (US);
Seyed Ali Hajimiri, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 83 days.

(21) Appl. No.: 11/107,402

(22) Filed: Apr. 14, 2005

(65) Prior Publication Data
US 2005/0258866 A1 Nov. 24, 2005

Related U.S. Application Data

(60) Provisional application No. 60/562,661, filed on Apr. 15, 2004.

(51) Int. Cl.
*H03K 19/082* (2006.01)
(52) U.S. Cl. .......................................... 326/89; 326/75
(58) Field of Classification Search .................. 326/62, 326/63, 68, 75, 82, 83, 89; 327/108, 109
See application file for complete search history.

(56) References Cited

U.S. PATENT DOCUMENTS 6,104,218 A * 8/2000 Ueno ........................... 327/112
6,147,540 A * 11/2000 Coddington ................. 327/333
6,693,469 B2 * 2/2004 Prodanov .................... 327/108

OTHER PUBLICATIONS

Rein, H.-M, et al. A Versatile Si-Bipolar Driver Circuit with High Output Voltage Swing for External and Direct Laser Modulation in 10 Gb/s Optical-Fiber Links, *IEEE J. Solid-State Circuits* (1994) 29(9):1014-1021.
Schmid, R., et al. "40Gbit/s EAM driver IC in SiGe bipolar technology", *Electronics Letters*, (1998) 34(11):1095-1097.
Schmid, R., et al. "SiGe Circuit with High Output Amplitude Operating up to 23 Gb/s", *IEEE J. Solid-State Circuits*, (1999) 34:886-891.
Friedman, D.J., et al. "SiGe BiCOMS integrated circuits for high-speed serial communication links", *IBM J. Research & Development* (2003) 47(2/3):277-279.

* cited by examiner

*Primary Examiner*—James H. Cho
(74) *Attorney, Agent, or Firm*—Townsend and Townsend and Crew

(57) ABSTRACT

An apparatus and method for driving an output signal in a high speed integrated circuit. The apparatus and methods enable the output voltage swing from the driver to exceed the breakdown voltage of any individual element in the output driver. A high speed driver can utilize one or more transistors in a stacked configuration, such that the breakdown voltage of the entire stacked configuration is based on the number of transistors in the stack. The driver is configured to distribute the output voltage substantially equally among each of the stacked transistors, such that the driver is able to source an output voltage swing that is greater than the breakdown voltage of any individual transistor in the driver.

23 Claims, 9 Drawing Sheets

INTEGRATED CIRCUIT WITH BREAKDOWN VOLTAGE MULTIPLIER

CROSS-REFERENCES TO RELATED APPLICATIONS

This application claims the benefit of U.S. Provisional Application No. 60/562,661, filed Apr. 15, 2004, entitled BREAKDOWN VOLTAGE MULTIPLIER; which is hereby incorporated herein by reference in its entirety.

STATEMENT AS TO RIGHTS TO INVENTIONS MADE UNDER FEDERALLY SPONSORED RESEARCH OR DEVELOPMENT

This invention was made with government support under grant N00014-01-1-0764 awarded by the Office of Naval Research. The government has certain rights in the invention.

BACKGROUND OF THE DISCLOSURE

The disclosure relates the field of electronic devices. More particularly, the disclosure relates to a high speed driver configuration that allows an output voltage swing to exceed the breakdown voltage of any individual transistor in the driver.

Processors and associated applications have developed to a level that enable enormous amounts of information to be generated and utilized. The capability of processors and associated applications to utilize vast amounts of information spurs the development of communication systems that enable the dissemination of such vast amounts of information. Communication systems are under constant pressure to increase the bandwidth available for distribution of information.

A communication system can have sufficient bandwidth allocated for distribution of vast amounts of information, but the rate that the information can be distribute across the communication system may be limited by the limitations of the communications hardware. The operating bandwidth of integrated circuits used in conjunction with high speed communication systems has continued to increase to help satisfy the desire to increase communication rates.

Silicon based integrated circuits can improve their operating bandwidth, in part, by increasing the bandwidth of the transistors used within the integrated circuit and decreasing bandwidth reducing parasitic effects. The operating bandwidth of the transistors within an integrated circuit can be increased, for example, by reducing the physical size of each transistor and reducing an operating voltage of the integrated circuit. Reducing the physical size of individual transistors reduces the parasitic effects, such as parasitic capacitance, that can reduce the bandwidth of the transistor. The operating voltage and the breakdown voltage of the transistors can be reduced due, in part, to the physical reduction in size. Although a reduction in the operating voltage can provide some benefits in the form of reduced power consumption, the combination of reduced operating voltage and reduced breakdown voltage can severely limit the applicability of integrated circuits implementing such high speed transistors.

It is desirable to maintain or further increase the operating bandwidth of circuits within an integrated circuit while simultaneously increasing the ability of the circuit to withstand greater operating voltages to enable the circuits to be used in a variety of high speed communication systems.

BRIEF SUMMARY OF THE DISCLOSURE

An apparatus and method for driving an output signal in a high speed integrated circuit. The apparatus and methods enable the output voltage swing from the driver to exceed the breakdown voltage of any individual element in the output driver. A high speed driver can utilize one or more transistors in a stacked configuration, such that the breakdown voltage of the entire stacked configuration is based on the number of transistors in the stack. The driver is configured to distribute the output voltage substantially equally among each of the stacked transistors, such that the driver is able to source an output voltage swing that is greater than the breakdown voltage of any individual transistor in the driver.

An integrated circuit device is disclosed. The device includes an output stage having a device output and a plurality of output transistors in a stacked configuration, and a signal distributor configured to receive an input signal at an input, generate a plurality of intermediate driver signals based on the input signal, and couple the intermediate driver signals to the output stage such that each output transistor contributes a portion of an output signal and a total output voltage swing exceeds a breakdown voltage of any one of the plurality of output transistors.

An other embodiment of the integrated circuit device includes a device input configured to receive a signal having a data rate that exceeds 9 Giga symbols per second, a drive transistor having a base coupled to the device input and configured to generate a first intermediate driver signal at a collector, a bias resistor configured to couple the collector of the drive transistor to a first voltage source, a capacitor coupled in parallel with the bias resistor and configured to delay a signal path through the drive transistor, a level shifter coupled to the device input and configured to generate a level shifted version of the input signal as a second intermediate driver signal, a first output transistor having a base coupled to the collector of the drive transistor and a collector coupled to a device output and configured to provide an output signal having a voltage swing that exceeds a breakdown voltage of any transistor within the device, a load resistor configured to couple the collector of the first output transistor to a second voltage source, and a second output transistor having a base coupled to the level shifter and a collector coupled to an emitter of the first output transistor.

A method of producing a drive signal includes receiving an input signal having a data rate that is greater than 5 Giga symbols per second, level shifting the input signal to produce a plurality of level shifted signals, generating a plurality of intermediate driver signals from the plurality of level shifted signals, coupling each of the plurality of intermediate driver signals to a corresponding one of a plurality of output transistors, wherein the plurality of output transistors are arranged in a stacked configuration, and providing an output signal from the plurality of output transistors, the output signal having a voltage swing that exceeds a breakdown voltage of any one of the plurality of output transistors.

Various features and advantages of the invention can be more fully appreciated with reference to the detailed description and accompanying drawings that follow.

BRIEF DESCRIPTION OF THE DRAWINGS

The features, objects, and advantages of embodiments of the disclosure will become more apparent from the detailed description set forth below when taken in conjunction with the drawings, in which like elements bear like reference numerals.

DETAILED DESCRIPTION OF EMBODIMENTS OF THE INVENTION

A high speed integrated circuit driver utilizing a breakdown voltage multiplier configuration allows output voltage swings that exceed the breakdown voltage of any individual transistor within the driver. The breakdown voltage multiplier configuration utilizes a plurality of transistors, each configured to withstand only a portion of the entire output voltage swing. Thus, each transistor contributes some incremental value to the breakdown voltage of the driver output.

The transistors can be configured such that the each transistor in an output stage contributes a substantially equal amount to the total output signal. The aggregate signal from all of the output transistors can have a total voltage swing that exceeds the breakdown voltage of any individual transistor in the output stage. If each transistor in the output stage contributes substantially equal amount to the output signal, the output voltage swing can be a multiple of the breakdown voltage of each individual transistor. The multiple can be determined based on the number of transistors in the output stage contributing to the output voltage.

A signal distributor can be used to distribute signals to the transistors in the output stage in a manner that ensures each output transistor contributes a substantially equal amount to the output signal. The signal distributor can be configured to maintain a particular signal magnitude and timing to each of the output transistors. The signal distributor can delay some signals relative to other signals in order to maintain signal integrity at the driver output.

Figure 1:
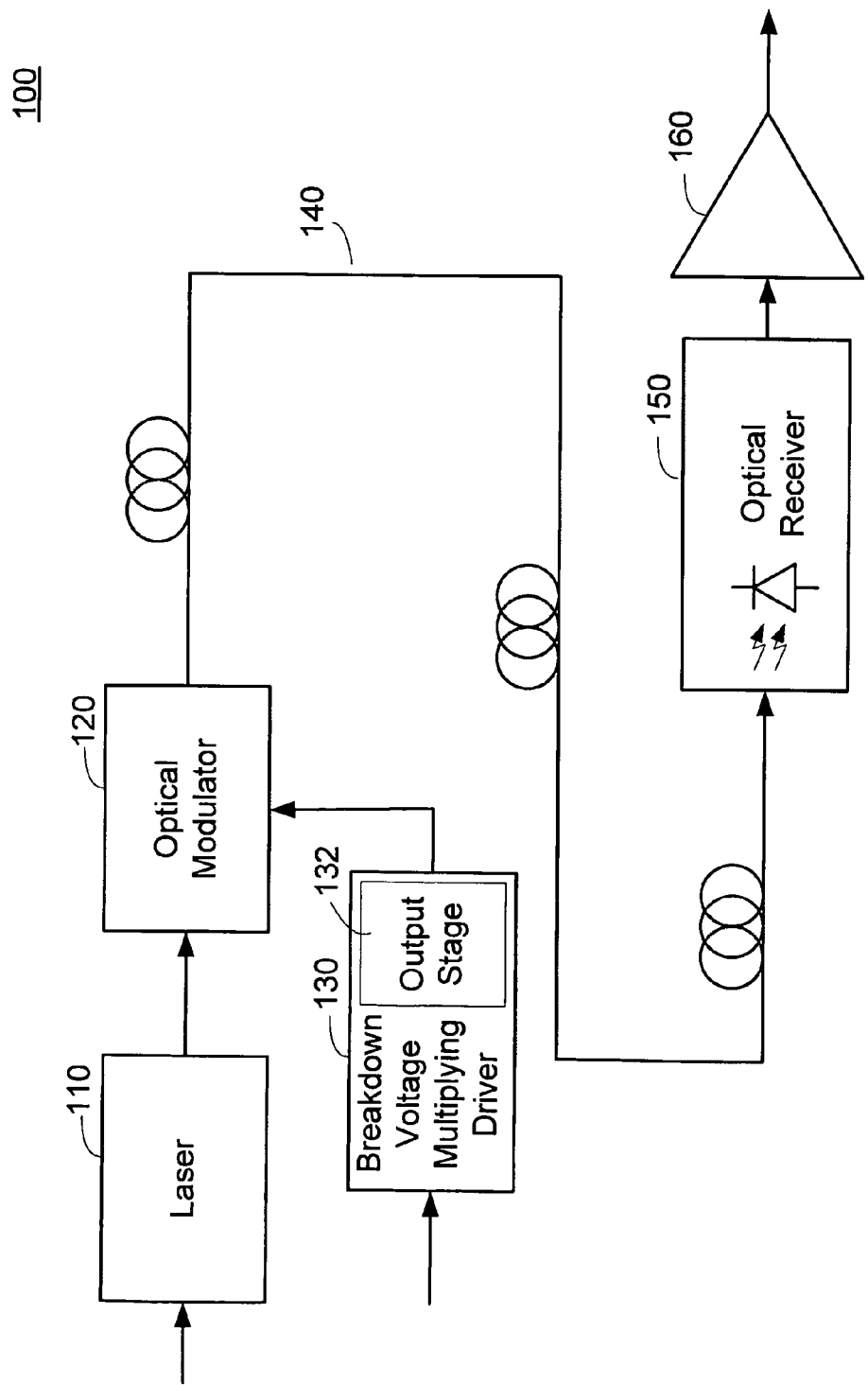
FIG. 1 is a simplified functional block diagram of an embodiment of a high speed communication system including a driver incorporating a breakdown voltage multiplier.

FIG. 1 is a simplified functional block diagram of an embodiment of a high speed communication system 100 having a driver incorporating a breakdown voltage multiplier. The system 100 is depicted as an optical communication link. However, the driver is not limited to use in an optical communication system, nor is the breakdown voltage multiplier limited to use in a driver for use in an optical communication system.

As used herein, the term "high speed," when used in connection with the description of a communication link or rate, can be interpreted to mean those systems, links, or communication rates for which the integrated circuits typically use transistors of reduced physical size and reduced operating voltages. For example, a high speed communication system can have a data rate that is greater than about 2 Gigabits per second (Gbps), 3 Gbps, 4 Gbps, 5 Gbps, 8 Gbps, 9 Gbps, 10 Gbps, or 20 Gbps. Where the high speed communication system transmits processed signals, such as signals having forward error correction, the data rate can be expressed in terms of symbols per second and the high speed communication system can have a data rate that is greater than about 2 Giga symbols per second (Gsps), 3 Gsps, 4 Gsps, 5 Gsps, 8 Gsps, 9 Gsps, 10 Gsps, or 20 Gsps.

There are several breakdown voltages that are often reported for bipolar junction transistors (BJT). The collector-emitter breakdown voltage, $BV_{cer}$, is typically the main limiting factor in the design of a high-voltage driver. This breakdown voltage is a function of the total base resistance, $R_B$, to an ac ground. The most commonly reported value is the collector-emitter breakdown voltage when the base is open, i.e. when $R_B=\infty$, often shown as $BV_{ceo}$. It is noteworthy that $BV_{ceo}$ is the lower bound of the collector-emitter breakdown voltage of the transistor. The value of breakdown voltage increases when the base is driven with a lower source impedance. For example, $BV_{ceo}=1.8V$ compared to $BV_{cer}>3.0V$ for $R_B<100\Omega$. The dependence on source impedance can be exploited in the designs of driver output stages utilizing the breakdown voltage multiplier.

High-speed drivers typically use some form of a current switch at the output stage. When a single active device withstands the entire output voltage swing, $BV_{cer}$ sets the limit on the maximum output voltage. By distributing the output voltage swing across multiple transistors, the output voltage swing can exceed the breakdown voltage of any individual transistor in the output stage.

The communication system 100 includes a laser 110. The laser is coupled to a modulator 120 that can be configured to amplitude modulate the laser 110 optical output based on a received modulation signal. A modulation driver 130 can be configured to receive a modulation signal and amplify it using a driver configuration that includes a breakdown voltage multiplying output stage 132. The modulation signal can represent the information to be transmitted to a remote destination. The output of the modulation driver 130 can be coupled to the modulation input of the modulator 120 to modulate the optical signal.

The modulated signal output from the modulator 120 can be coupled to a channel, such as an optical fiber 140. The optical fiber 140 can be configured to couple the modulated optical signal to a remote destination. Although the optical fiber 140 is shown as a direct link, a communication channel may include one or more intervening elements, such as switches, couplers, and amplifiers.

An optical receiver 150 can be positioned at a remote destination and can be configured to couple the modulated optical signal from the optical fiber 140. The optical receiver 150 can include, for example, a photo detector configured to recover the modulation signal from the optical signal. The output of the optical receiver 150 can be coupled to an amplifier 160, such as an instrumentation amplifier, configured to amplify the received signal and distribute it to another module (not shown) for further processing or utilization.

While most of the building blocks in a fiber optic communication system 100 can be implemented in silicon for high speed communication links operating at 10 Gb/s and above, the optical modulator electrical driver 130 has been primarily done in compound semiconductors. This is mainly due to breakdown limitations of silicon transistors and large required voltage swings of high-speed optical modulators 120. However, the process technology disparity between a compound semiconductor driver and the remainder of the transceiver can result in additional cost and performance penalties. The driver 130 can include an output stage 132 including a breakdown voltage (BV) multiplier topology that overcomes the breakdown limitations of SiGe transistors. The output stage 132 implementing the breakdown voltage multiplier enables high-speed broadband drivers 120 manufactured in silicon to have a large voltage swing, and in particular, a voltage swing that exceeds the breakdown voltage of any individual transistor in the output stage 132.

Existing electro-absorption and Mach-Zehnder (MZ) optical modulators 120 typically require voltage swings in the range of 4 to 8 volts to achieve a high extinction ratio. That is, these voltage swings are typically required to effectively switch the light on and off. Such a large voltage swing poses a challenge for silicon-based transistors (SiGe HBT or Si CMOS) whose breakdown voltages can decrease when the transistors are scaled for higher speed. While there have been reports of driver circuits in SiGe for optical applications, these circuits typically drop the entire voltage swing across single transistors and thus cannot exceed the collector-emitter breakdown voltages and are hence limited to a voltage swing approximately equal to the breakdown voltage of a single transistor manufactured according to SiGe processes, which can be typically around 3 volts.

Figure 2:
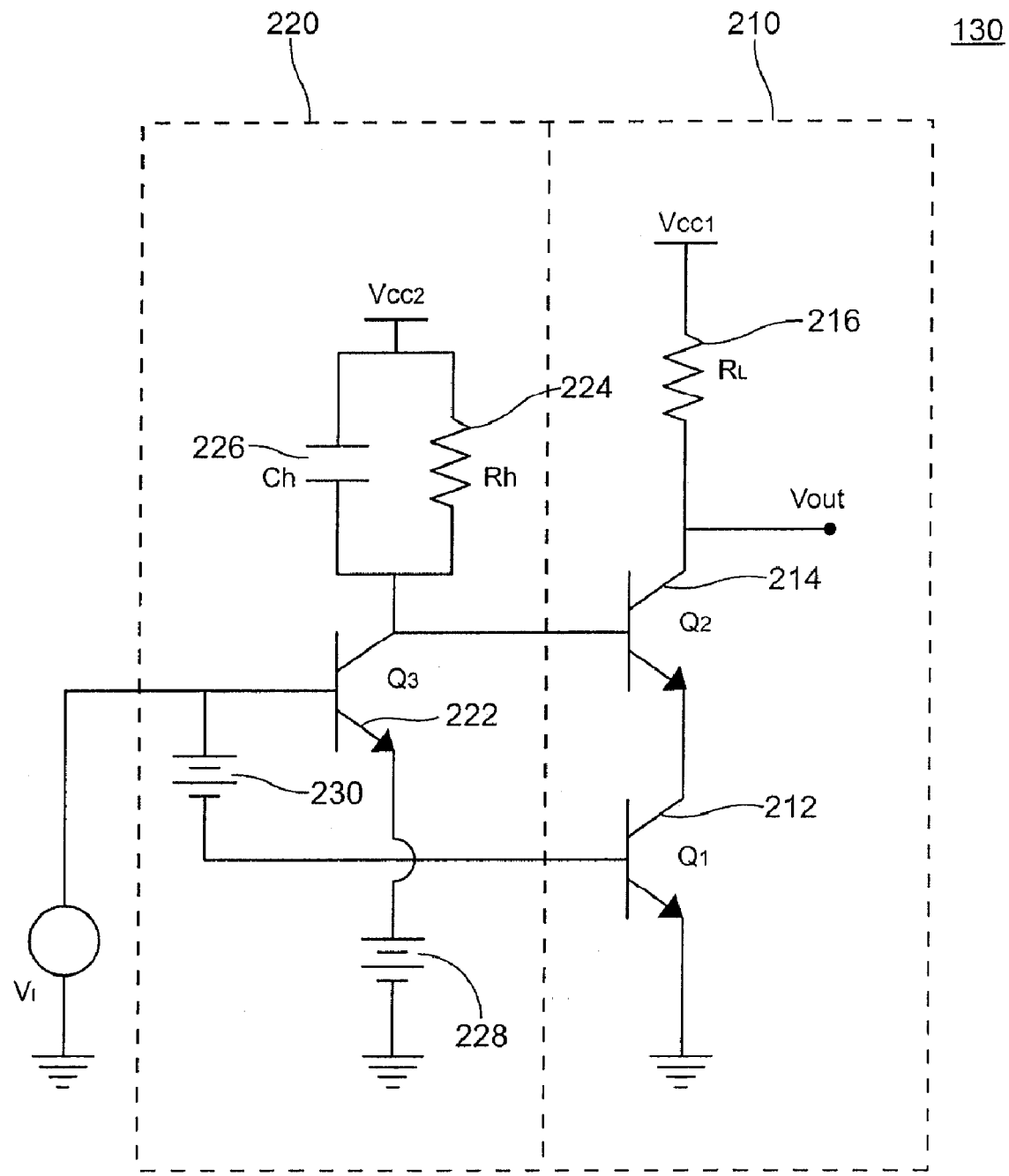
FIG. 2 is a simplified schematic diagram of an embodiment of a driver incorporating a breakdown voltage multiplier.

FIG. 2 is a simplified schematic diagram of an embodiment of a driver 130 configured for breakdown voltage doubling. The driver 130 can be, for example, the driver shown in the system of FIG. 1.

The driver 130 can include an output stage 210 driven by a signal distributor 220. The output stage 210 can be configured to divide the total output voltage swing among a plurality of transistors 212 and 214. If each of the transistors 212 and 214 can be configured to contribute substantially equally to the output voltage, the total output voltage swing can be a multiple of the breakdown voltage for any of the transistors in the output stage.

The output stage 210 can include a plurality of NPN BJT transistors with a lower transistor (Q1) 212 coupled to an upper transistor (Q2) 214 in a stacked configuration. In the stacked configuration, the emitter of the second transistor 214 can be coupled to the collector of the first transistor 212.

The collector of the second transistor 214 can drive an output load resistor 216. The bases of the two transistors 212 and 214 can be driven independently by outputs from the signal distributor 220.

In principle, the output voltage swing can be broken down among several transistors in a cascode configuration to alleviate the breakdown voltage limitations of the transistors. However, in a standard cascode configuration, the base of the upper transistor is biased at a constant voltage. The emitter voltage will remain relatively constant due to the logarithmic dependence of $V_{BE}$ on $I_C$. For a fixed base voltage, most of the output voltage swing will still appear across the upper transistor, rendering this approach ineffective.

On the other hand, if the base of the upper second transistor 214 is driven with the same polarity as the output, the emitter of the second transistor 214 will track the base drive at a similar rate since the second transistor 214 behaves as an emitter-follower for the base drive. This will effectively divide the voltage swing between the top ($Q_2$) and bottom ($Q_1$) transistors, 214 and 212 respectively, in both on and off states, as well as during the transitions.

Ideally, the output voltage swing is divided equally or substantially equally between the two transistors 212 and 214. To accomplish this the base of $Q_2$ 214 should be driven with approximately half the voltage swing of its collector ($V_{out}$) to maintain substantially equal voltage division between the upper and lower transistors 214 and 212 respectively.

The signal distributor 220 includes an input that can receive the signal to be driven by the output stage 210. The input can be coupled to the base of a drive transistor 222. The emitter of the drive transistor 222 can be offset from a ground or a voltage common by a predetermined voltage 228. The collector of the drive transistor 222 can be pulled up to a voltage source by a bias resistor 224. The bias resistor 224 appears as a resistor from the base of the upper transistor 214 to an ac ground. Recall that the breakdown voltage of a transistor is determined in part based on the base resistance. Therefore, the value of the bias resistor 224 can be selected to maintain a breakdown voltage in the upper transistor 214.

A timing adjustment capacitor 226 can be positioned in parallel with the bias resistor 224. The purpose of the timing adjustment capacitor 226 is explained in further detail below. The collector of the drive transistor 222 represents an output from the signal distributor 220 for the upper transistor 214 in the output stage 210.

The input is also coupled to a predetermined voltage source 230 that couples an offset, or level shifted, version of the input signal to the output of the signal distributor 220 for the lower transistor 212 in the output stage 210. The predetermined voltage source 230 can operate as a level shifter.

The predetermined voltage source 230 can have a value that is substantially the same as the value of the predetermined voltage source 228 used to offset the base of the drive transistor 222. The value of the predetermined voltage source 230 can be selected based in part on the value of the collector voltage of the driver transistor 222.

The relative timing of the signal paths to the output plays an important role in the integrity of the output waveform. A first path to output via $Q_1$, 212 and $Q_2$ 214 can be slightly slower than auxiliary path through the drive transistor 222 and $Q_2$ 214. If no effort is made to compensate this timing mismatch, each path will induce changes on the output at different times, resulting in a distorted output voltage. The distortion on the output attributable to timing differences can be compensated by slowing the auxiliary path via introduction of an additional timing adjustment capacitor, $C_h$ 224, on the collector of $Q_3$ 222. The value of the timing adjustment capacitor $C_h$ 224 can be selected such that the delays of the two signal paths to the driver output can be equalized.

In an example of the breakdown voltage doubler embodiment of FIG. 2, a conservative maximum $V_{CE}$ limit of 2.5V and a minimum of 0.5V can be maintained to avoid excessive base charge storage and its associated speed degradation. Each of the output stage 210 transistors 212 and 214 experiences a voltage swing of approximately 2V. The corresponding single-ended output voltage swing is 4V. The 2V constraint on $V_{CE}$ is much lower than that used in earlier designs resulting in a more reliable design.

Figure 3:
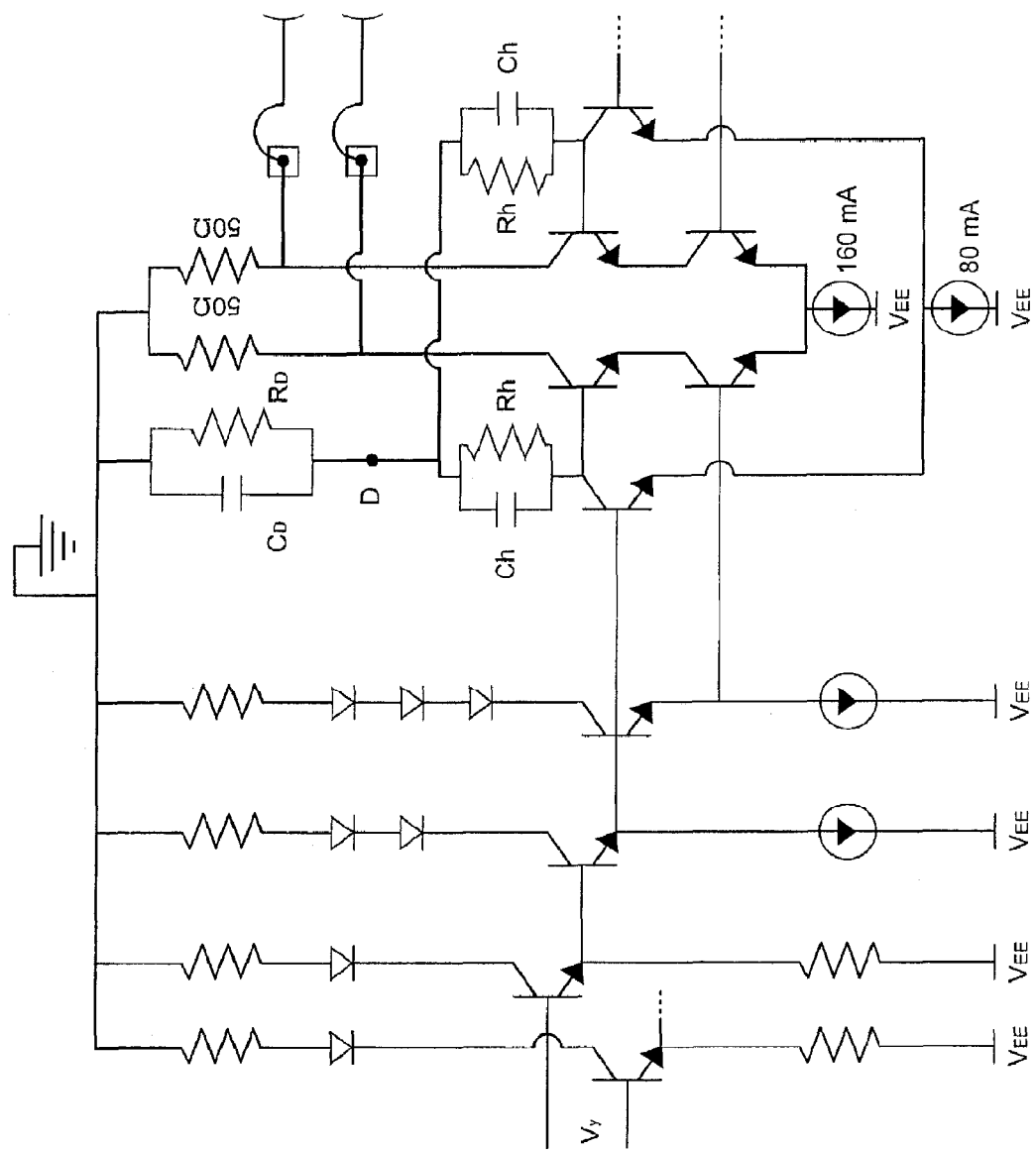
FIG. 3 is a simplified schematic diagram of an embodiment of a driver incorporating a breakdown voltage multiplier.

FIG. 3 is a simplified schematic diagram of an embodiment of a driver 132, such as the driver shown in the system of FIG. 1. The driver 132 shown in FIG. 3 is configured with a breakdown voltage doubling output stage and is configured for differential input and output. Only a portion of the schematic is shown for the purposes of clarity. The configuration of the transistors utilized to complete the differential implementation can be determined by examination of FIG. 3.

In the embodiment of FIG. 3, several emitter follower stages precede the main driver stage to lower the source impedances and provide the appropriate dc levels to both main and auxiliary paths. Additional resistors and diodes are used in the collectors of these emitter followers to avoid excessive $V_{ce}$ and potential breakdown problems. The output stage of the driver includes a main differential path and an auxiliary differential path with timing adjustment capacitors $C_h$ on each side. The resistor $R_D$ lowers the common-mode dc level seen by the auxiliary path and has virtually no effect on the differential signal as node D is virtual ground. Capacitor $C_D$ can be used to lower the common-mode impedance on node D to suppress even mode variations.

Figure 4:
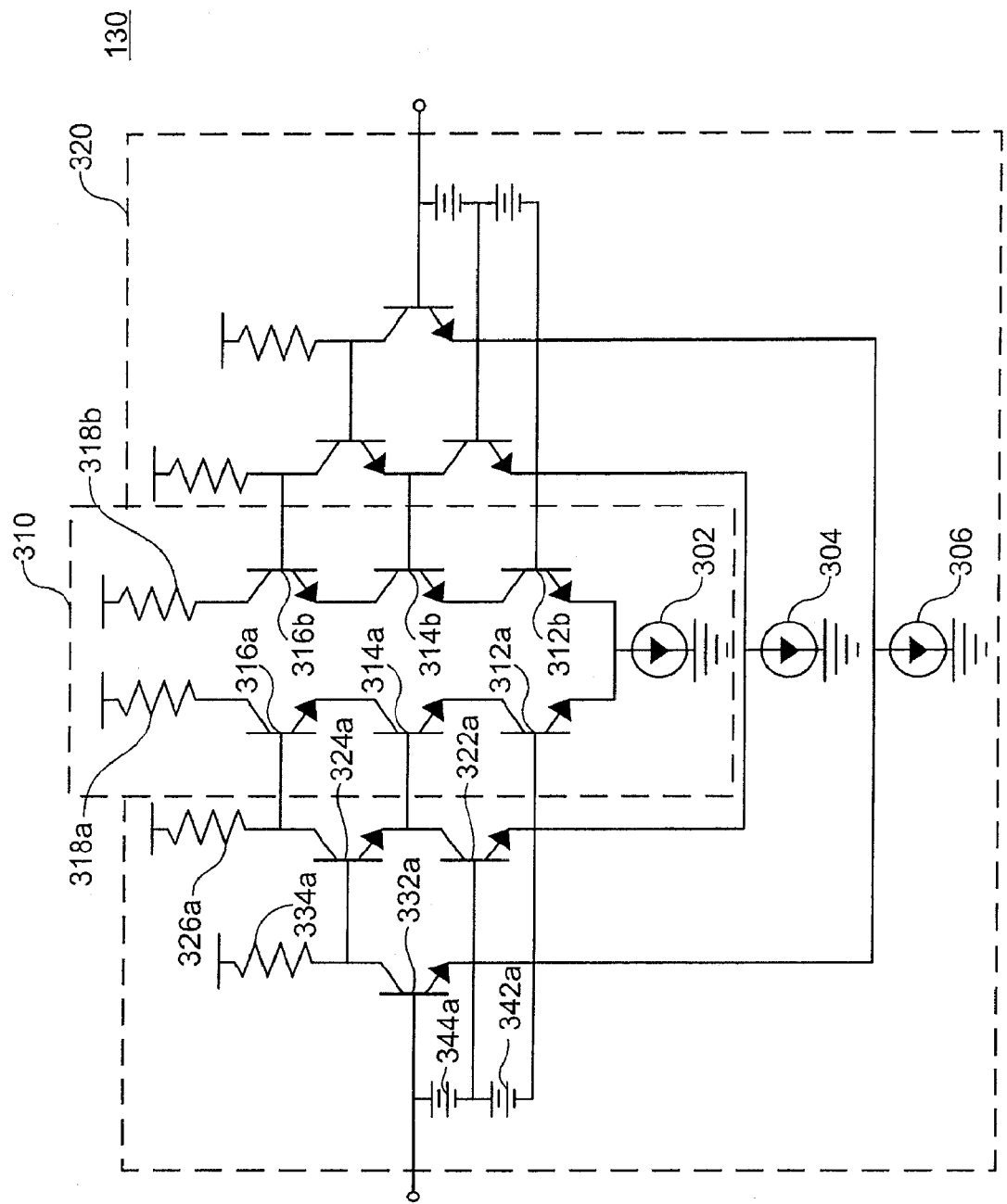
FIG. 4 is a simplified schematic diagram of an embodiment of an output stage of a driver incorporating a breakdown voltage tripler.

FIG. 4 is a simplified schematic diagram of an embodiment of a driver 132 configured with a breakdown voltage tripling output stage and configured for differential input and output. The following description focuses on one half of the differential driver 132 configuration. The mirror half of the differential driver 132 is configured in a similar manner. The timing adjustment capacitors in the signal distributor are not shown. However, one or more timing adjustment capacitors can be included in the signal distributor 320, for example, in parallel with first and second pull up resistors 334a and 326a in order to equalize the signal paths to the driver output.

The driver 132 includes a differential output stage 310 having three transistors in a stacked configuration. A first output transistor 312a has an emitter coupled to a current source 302 coupled to ground or voltage return. The first output transistor 312a has a base configured to receive a first output from the signal distributor 320.

A second output transistor 314a has an emitter coupled to a collector of the first output transistor 312a. The base of the second output transistor 314a is configured to receive a second output from the signal distributor 320. Similarly, a third output transistor 316a has an emitter coupled to the collector of the second output transistor 314a. The base of the third output transistor 316a is configured to receive a third output from the signal distributor 320. The collector of the third output transistor 316a is coupled to a load resistor 318a that pulls up the collector to an output voltage source. The collector of the third output transistor 316a represents one output from the differential output stage 310.

The differential output stage 310 is driven by a differential signal distributor 320 configured to provide three separate signal outputs, one corresponding to each of the stacked output transistors 312a, 314a, and 316a in the output stage 310. The signal distributor 320 is configured to receive an input signal and provide three separate output signals that substantially equalize the contribution from each of the output transistors 312a, 314a, and 316a to the output signal. Each output transistor 312a, 314a, and 316a contributes substantially one third of the output voltage. Thus, the output voltage swing can be up to approximately three times the breakdown voltage of any individual output transistor.

The input signal to the driver 132 is coupled to the input of the signal distributor 320. The one half of a differential input signal is coupled to a first drive transistor 332a and to a first level shifter, here shown as a first predetermined voltage source 344a.

The level shifted output from the first predetermined voltage source 344a is coupled to a second level shifter, shown as a second predetermined voltage source 342a. The output of the second predetermined voltage source 342a represents the first output from the signal distributor, and is coupled to the base of the first output transistor 312a.

The level shifted output from the first predetermined voltage source 344a is also coupled to a base of a second drive transistor 322a. The emitter of the second drive transistor 322a is coupled to a second current source 304 that couples the emitter to a ground or voltage common. The collector of the second drive transistor 322a represents the second output from the signal distributor 320 and is coupled to the base of the second output transistor 314a.

The emitter of the first drive transistor 332a is coupled to a third current source that couples the emitter to a ground or voltage common. The collector of the first drive transistor 322a is coupled to a base of a third drive transistor 324a. The collector of the first drive transistor 332a is also coupled to a first pull up resistor 334a that pulls up the collector to a voltage source.

The third drive transistor 324a is arranged in a stacked configuration with the second drive transistor 322a. That is, the emitter of the third drive transistor 324a is coupled to the collector of the second drive transistor 322a. The collector of the third drive transistor 324a is coupled to a second pull up resistor 326a that pulls up the collector to the voltage source. The collector of the third drive transistor 324a represents the third output from the signal distributor 320.

The signal distributor 320 ensures that the output voltage is substantially equally divided among the three output transistors, such that the breakdown voltage of the output stage 310 can be approximately three times the breakdown voltage of any individual output transistor.

Figure 5:
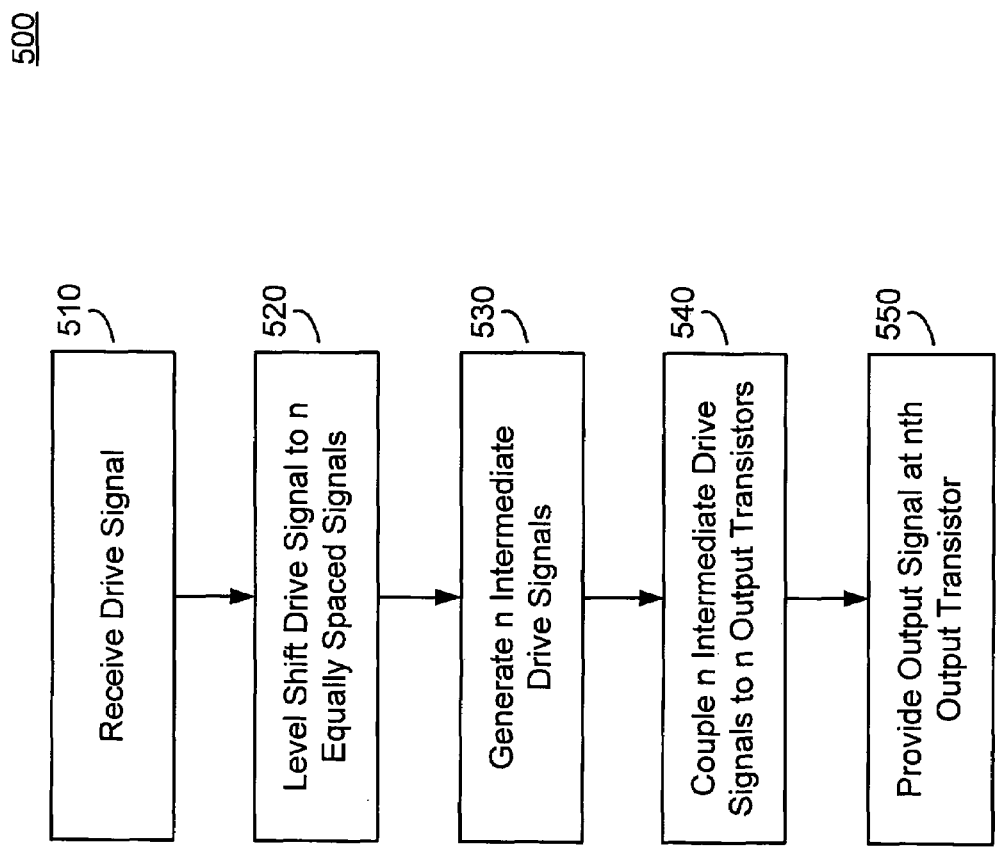
FIG. 5 is a simplified flowchart of a method of breakdown voltage multiplication.

FIG. 5 is a simplified flowchart of a method 500 of breakdown voltage multiplication in a driver. The method 500 can be implemented, for example, by the driver embodiments shown in FIG. 2, 3, or 4.

The method 500 begins at block 510 when the driver receives a drive signal. The drive signal can be, for example, a modulation signal that is used to drive an optical modulator, such that the drive signal is modulated onto the optical signal.

The driver proceeds to block 520 where the driver level shifts the drive signal into n equally spaced signals. The number n represents the breakdown voltage multiplier and also represents the number of stacked output transistors in the output stage of the driver. The n equally spaced signals can be generated by inserting a configuration of n−1 substantially equal voltage sources in series with the drive signal. The n equally spaced signals correspond to the signals at the input and following each of the n−1 voltage sources.

The driver proceeds to block 530 and generates n intermediate drive signals from the n equally spaced signals. Each of the intermediate drive signals is used to drive a corresponding one of the stacked output transistors. Because the phase of the intermediate drive signal can be configured to be in phase with the output from the corresponding output transistor, some of the equally spaced signals can be phase inverted during generation of the intermediate drive signals. Additionally, because the various signal paths through the driver may not have equal time delays, the driver can delay one or more of the signal paths corresponding to one or more of the intermediate drive signals in order to equalize the signal path delays.

After generating the intermediate drive signals, the driver proceeds to block 540 where the intermediate drive signals are coupled to corresponding n output transistors that are implemented in a stacked configuration. The driver proceeds to block 550 and provides or otherwise sources the output signal at the nth output transistor, where the nth output transistor represents the output transistor coupled to the load resistor.

Figure 6:
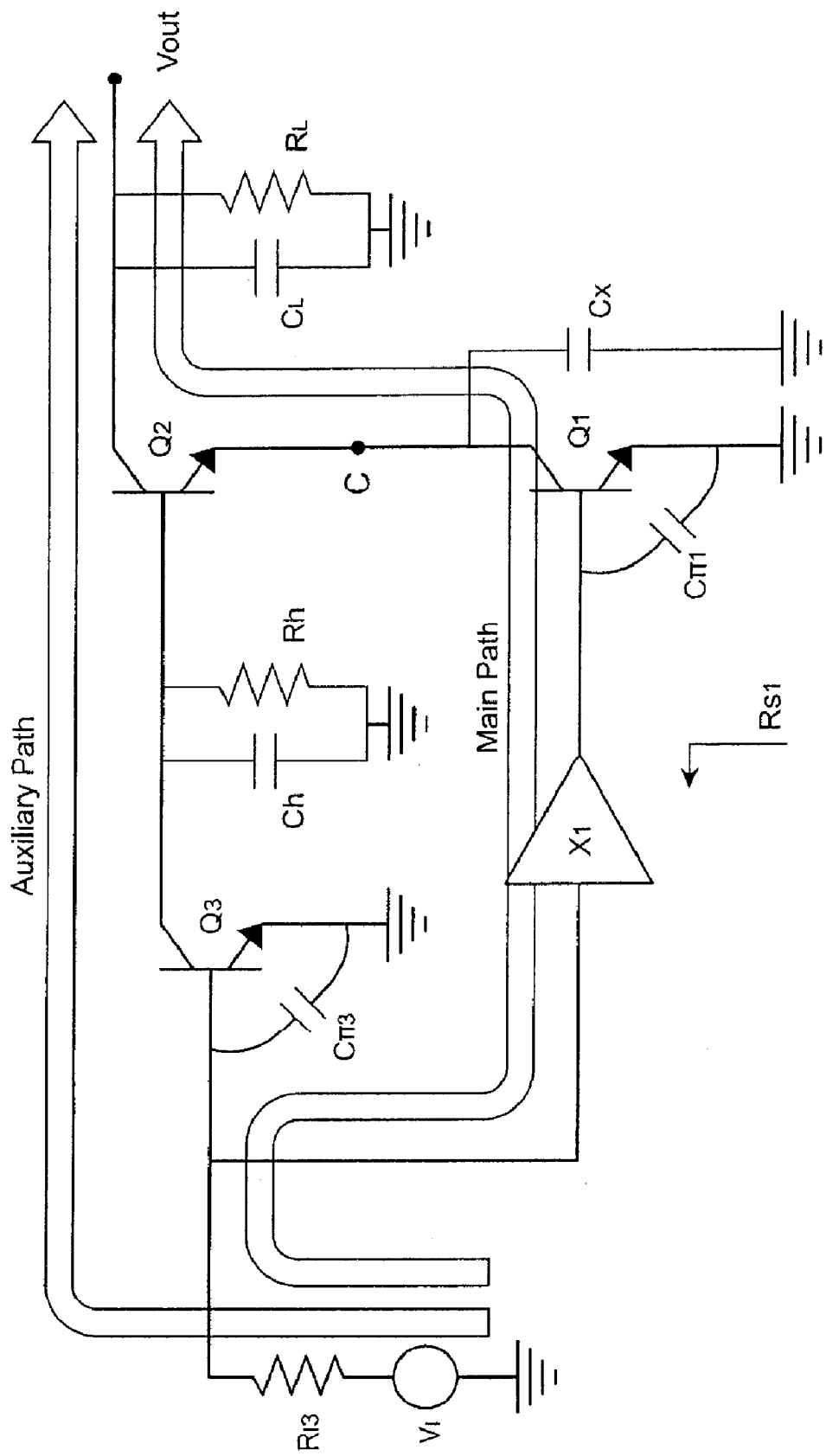
FIG. 6 is a simplified half-circuit small-signal equivalent of the output stage.

FIG. 6 is a simplified half-circuit small-signal equivalent of the output stage. The forward signal path consists of two parallel paths with different dynamics. The main path consists of an emitter follower buffer whose dynamics is non-dominant, followed by the common-emitter transistor, $Q_1$, and the common-base transistor, $Q_2$, driving the output node. It has an inverting small-signal dc gain of:

$$A_1 = -g_{m1} R_L \qquad (1)$$

where $g_{m1}$ is the transconductance of $Q_1$ and $R_L$ is the output load resistance. The non-inverting small-signal dc gain of the auxiliary path is given by:

$$A_2 = g_{m3} R_h \cdot \frac{g_{m2} R_L}{1 + g_{m2} r_{o1}} \cong \frac{g_{m3} R_h R_L}{r_{o1}} \qquad (2)$$

where $g_{m3}$ and $g_{m2}$ are the transconductances of $Q_3$ and $Q_2$, respectively, and $r_{o1}$ is the output resistance of $Q_1$. This path consists of a common emitter stage with a gain of $-g_{m3} \cdot R_h$ and another highly degenerate common-emitter with a gain of $-R_L/r_{o1}$. The dc gain from the input to the collector of $Q_3$, $-g_{m3} \cdot R_h$, is approximately one-half of $A_1$ to guarantee equal division of the voltage swing at the output, as discussed in the previous section.

The dynamics of the main path is dominated by the pole at the input of $Q_1$, $p_{\pi 1}$ approximately given by:

$$P\pi 1 \cong \frac{-1}{C_{\pi 1}[(R_{S1} + r_{b1})\| r_{\pi 1}] r_{o1}} \approx \frac{-1}{C_{\pi 1}(R_{S1} + r_{b1})} \qquad (3)$$

where $R_{s1}$ is the output resistance of the buffer driving the base, and $r_{b1}$ is the physical base resistance of $Q_1$. Since $r_{\pi 1}$ is much greater than $R_{s1} + r_{b1}$, it has a small effect on the pole frequency and it can be ignored. The auxiliary path has a slightly more complex dynamics. There is a pole at the input of $Q_3$, $P_{\pi 3}$, which is given by:

$$P\pi 3 \cong \frac{-1}{C_{\pi 3}[(R_{S3} + r_{b3})\| r_{\pi 3}]} \approx \frac{-1}{C_{\pi 3}(R_{S3} + r_{b3})} \qquad (4)$$

where $R_{s3}$ is the source resistance of the emitter follower driving $Q_3$ and $r_{b3}$ is its physical base resistance. The timing capacitance, $C_h$, introduces another pole, $p_h$, which is:

$$Ph \cong \frac{-1}{R_h C_h} \qquad (5)$$

Additionally, the total parasitic capacitance on node C, $C_x$, generates a non-dominant pole around the transistor's cut-off frequency, $\omega_T$, and a left half plane (LHP) zero at:

$$z_x \cong \frac{-1}{r_{o1} C_x} \qquad (6)$$

Hence, the transfer function for the main path can be described as:

$$H_1(s) \cong \frac{A_1}{1 + s/p_{\pi 1}} \qquad (7)$$

Similarly, the auxiliary path's transfer function is modeled as:

$$H_2(s) = A_2 \frac{(1 + s/z_x)}{(1 + s/p_{\pi 3})(1 + s/p_h)} \qquad (8)$$

Figure 7:
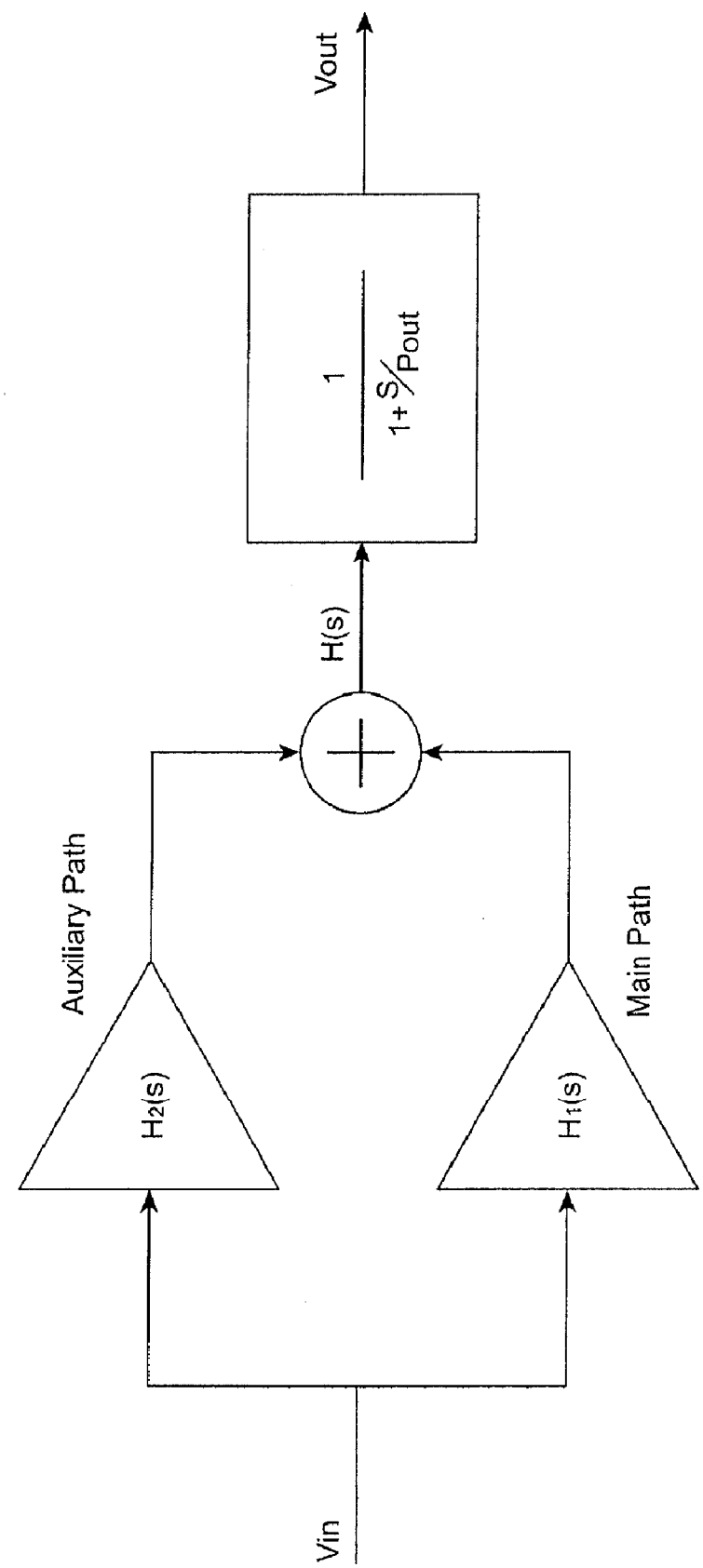
FIG. 7 is a simplified block diagram of a driver model.

The complete system can be modeled as the parallel combination of these two paths followed by the non-dominant pole at the output, as shown in FIG. 7. Ignoring the non-dominant output pole, the equivalent transfer function of the resultant system is:

$$H(s) = H_1(s) + H_2(s) = A \frac{(1 + s/z_1)(1 + s/z_2)}{(1 + s/p_{\pi 1})(1 + s/p_{\pi 3})(1 + s/p_h)} \qquad (9)$$

where $A = A_1 + A_2$, and $z_1$ and $z_2$ are new real zeros. It is noteworthy that the transfer function of the compound system, H(s), has the same poles as $H_1(s)$ and $H_2(s)$, but a different pair of zeros, whose values depend on $C_h$.

Figure 8:
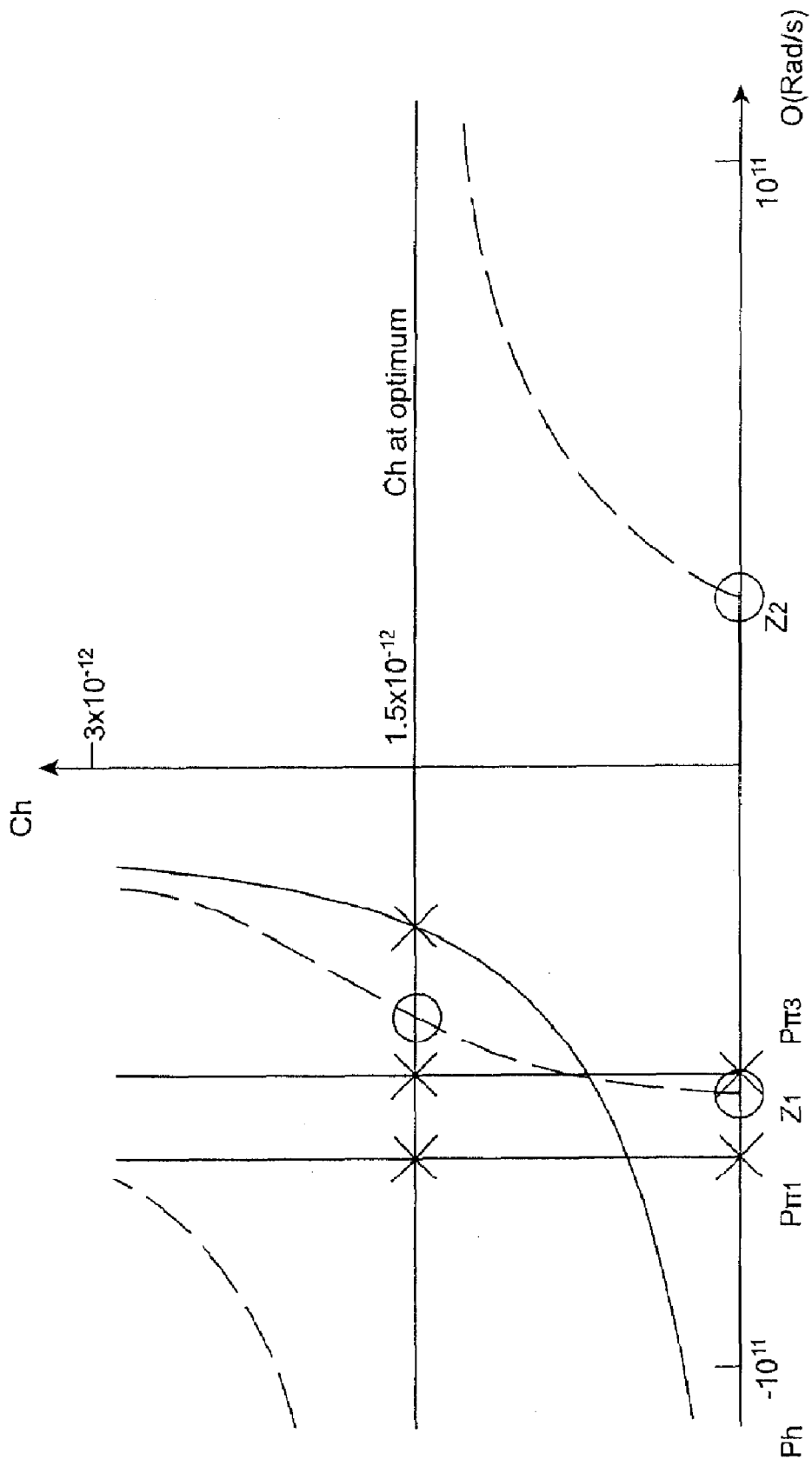
FIG. 8 is a representation of poles and zeros of the driver.

FIG. 8 shows how the real poles and zeros of the overall system move as a function of $C_h$ (y-axis). As can be seen, initially we have a right half plane (RHP) zero, $z_2$, whose phase contribution can degrade the waveform. By increasing $C_h$, this zero is quickly pushed to higher frequencies and eventually becomes a non-dominant LHP zero. On the other hand, $p_h$, is initially completely non-dominant but quickly moves in to become dominant. Fortunately, $z_1$ moves close to $p_h$ and hence partially compensates $p_h$ and $p_{\pi 3}$ at the optimum point.

Experimental Results

The driver was fabricated in IBM's 0.18 μm SiGe BiCMOS process. For this design, only SiGe HBTs with an $f_T$ of 120 GHz were used.

A) Setup

The chip could not be directly mounted on a ground plane because the silicon substrate had to be at a negative supply relative to ground. Thus, the chip was placed on an inexpensive CVD thick-film diamond (grown by SP3 Diamond Cutting Tools) for good heat dissipation and electrical insulation. The chip and the crystal were then placed on a piece of brass. All three were connected using conductive silver epoxy (Epoxy Tech. H20E). A PCB (Rogers Corp. RT5880) was attached to the brass to carry the signals to and from the chip. All the pads were wire bonded including the signal input and output pads. Input and output wire bonds were directly connected to 50Ω transmission lines leading to SMA connectors. Before testing, the chip and the wire-bonds were covered with thermally conductive and electrically insulative epoxy (Epoxy Tech. H70E) to allow for better heat dissipation and protect the die. The input was differentially fed using a pulse pattern generator (Anritsu MPI763C). The output was connected in many different configurations for both electrical and optical testing. For electrical testing a 50 GHz oscilloscope sampling head (Agilent 83484A) was used.

B) Measurements

Figure 9:
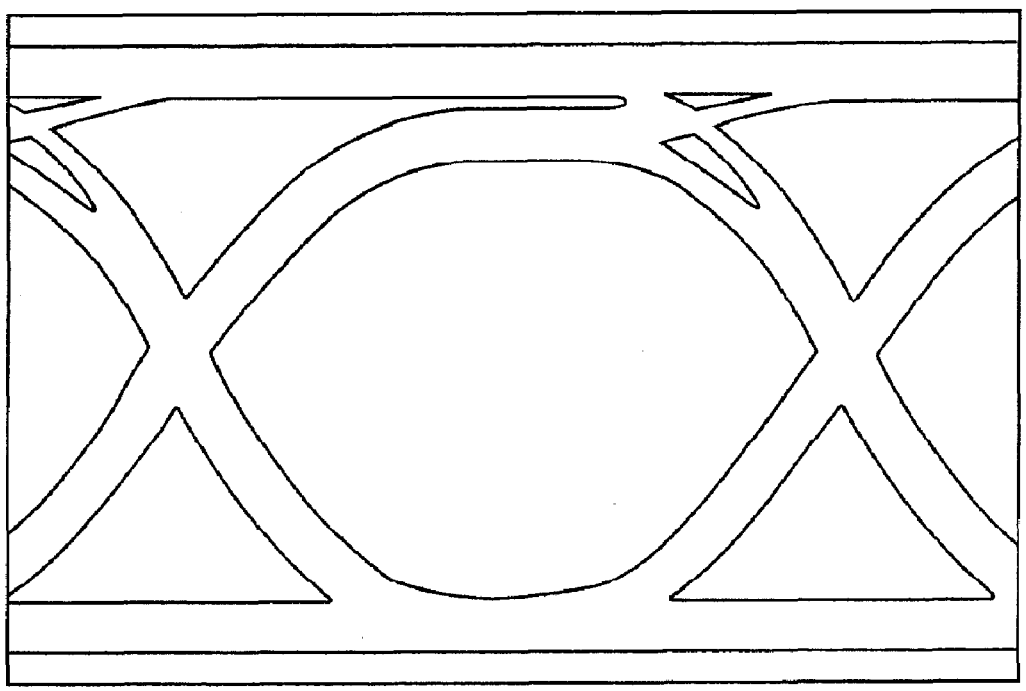
FIG. 9 is an electrical eye diagram of the single-ended output of an embodiment of a driver.

The measured differential output swing at 10 Gb/s was between 7V to 8V depending on the power supply voltage. The eye diagram in FIG. 9 is an electrical eye diagram of the single-ended output of the driver with a 3.8V swing. For the eye diagram of FIG. 9 the output signal was connected through a bias T and a 20 dB attenuator to the oscilloscope. The power supply was −6.5V and the current drawn was 562 mA. The input signal was differential 10 Gb/s with 250 mV swing on each input. The chip was tested for extended periods of time both optically and electrically, measuring the bit error rate (BER). No error was observed running the driver continuously for more than three days at 10 Gb/s, setting an upper bound of $10^{-5}$ on the BER.

This topology divides the output swing equally on two transistors allowing an output voltage swing of substantially $2BV_{cer}$ without exceeding $BV_{cer}$ on any single transistor. This topology synchronously drives the base voltage of the upper transistor. The measured chip had a differential output swing of 8 Vpp at 10 Gb/s. A very conservative maximum value of $V_{CE}$ was used in designing this circuit. This process technology can sustain a $V_{CE}$ swing as high as 3.2V, and therefore, using the same process technology and design, one can achieve a differential voltage swing up to 12.8V.

An apparatus and method for breakdown voltage multiplication in an integrated circuit driver has been described herein. The driver includes an output stage that is driven by a signal distributor. The driver can be configured with single-ended or differential input and can have single-ended or differential output.

The output stage includes a plurality of transistors in a stacked configuration. In the stacked configuration, the emitter of an upper transistor is coupled to the collector of a lower transistor. The emitter of the lower most transistor can be coupled to a ground or voltage return. The collector of the upper most transistor can be pulled up by a load resistor and the collector can be the output of the driver.

The bases of the plurality of transistors in the output stage can be individually driven by corresponding outputs from the signal distributor. Each of the plurality of transistors in the output stage can be configured to contribute substantially equally to the output voltage from the driver. The output voltage swing can exceed the breakdown voltage of any individual transistor in the output stage. The base resistance can be reduced below a desired threshold for each of the plurality of transistors in the output stage in order to increase the breakdown voltage of each individual transistor.

The signal distributor can receive a single input signal, which may be single-ended or differential, and can generate a plurality of intermediate driver signals. The number of intermediate driver signals can correspond to the number of transistors in the output stage.

Each of the intermediate driver signals can be a copy of the input signal or a level shifted version of the input signal. The signal distributor generates the level shifted versions of the input signal in order to ensure that each of the output transistors contributes substantially equally to the output signal. The signal distributor may also invert the phase of one or more of the intermediate driver signals such that the intermediate driver signals are of the same phase as the signals at the collector of the corresponding transistor.

The driver with breakdown voltage multiplication is described in terms of a driver for an optical modulator. However, the driver is not limited to such application. Instead, the driver can be used in any high speed application in which the output voltage swing can be expected to exceed the breakdown voltage of an individual transistor in the driver.

Although the driver is described in conjunction with a breakdown voltage doubler and breakdown voltage tripler, the driver is not limited to these configurations. For example, the driver can be configured for other breakdown voltage multipliers.

The driver is also described using NPN BJT devices. However, the driver or, in general, an integrated circuit and the breakdown voltage multiplier configuration are not limited to NPN BJT implementations. For example, another embodiment can utilize PNP devices or a combination of NPN and PNP devices in the signal distributor and output stages. Other embodiments may use HBT or HEMT devices. Other embodiments may use FETs or a combination of FET and BJT devices. In general, the breakdown voltage multiplier can be implemented in an integrated circuit using any suitable active device, including any suitable three terminal active device.

The driver can also have one or more stages in addition to the signal distributor and output stage. For example, a pre-driver can be implemented prior to the signal distributor. The pre-driver can include one or more emitter follower stages to reduce the source impedance seen at the input of the signal distributor.

The embodiments are described in the context of devices or elements that can be coupled to one another. The coupling can be direct or indirect. Direct coupling can include mechanical coupling as well as communicative coupling. Where two or more devices are indirectly coupled, one or more devices or elements may be interposed between the coupled elements. The one or more devices or elements may process or otherwise operate on a signal communicated between devices.

The steps of a method, process, or algorithm described in connection with the embodiments disclosed herein may be embodied directly in hardware, in a software module executed by a processor, or in a combination of the two. The various steps or acts in a method or process may be performed in the order shown, or may be performed in another order. Additionally, one or more process or method steps may be omitted or one or more process or method steps may be added to the methods and processes. An additional step, block, or action may be added in the beginning, end, or intervening existing elements of the methods and processes.

The above description of the disclosed embodiments is provided to enable any person of ordinary skill in the art to make or use the disclosure. Various modifications to these embodiments will be readily apparent to those of ordinary skill in the art, and the generic principles defined herein may be applied to other embodiments without departing from the spirit or scope of the disclosure. Thus, the disclosure is not intended to be limited to the embodiments shown herein but is to be accorded the widest scope consistent with the principles and novel features disclosed herein.

What is claimed is:

1. An integrated circuit device, the device comprising:
   an output stage having a device output and a plurality of output transistors in a stacked configuration; and
   a signal distributor configured to receive an input signal at an input, generate a plurality of intermediate driver signals based on the input signal, and couple the intermediate driver signals to the output stage such that each output transistor contributes a portion of an output signal and a total output voltage swing exceeds a breakdown voltage of any one of the plurality of output transistors, and wherein the signal distributor is further configured to generate the plurality of intermediate driver signals such that each of the plurality of output transistors contributes a substantially equal portion of the output signal, and wherein the signal distributor is configured to substantially equalize a delay from the input to the device output for signal paths through each of the plurality of output transistors.

2. The device of claim 1, wherein the output stage comprises:

a first transistor having a collector coupled to the device output and a base coupled to a first intermediate driver output from the signal distributor;

a second transistor having a collector coupled to an emitter of the first transistor and a base coupled to a second intermediate driver output from the signal distributor; and a load resistor coupled to the collector of the first transistor and a DC voltage source.

3. The device of claim 2, wherein the output stage further comprises a third transistor having a collector coupled to an emitter of the second transistor and a base coupled to a third intermediate driver output from the signal distributor.

4. The device of claim 1, wherein the output stage comprises a differential output stage with each of a complementary subset of output transistors in the differential output stage arranged in the stacked configuration.

5. The device of claim 1, wherein the signal distributor is further configured to reduce an impedance at each base of the plurality of output transistors to below a predetermined impedance.

6. The device of claim 1, wherein the input signal comprises a signal having a data rate that exceeds 9 Giga symbols per second.

7. The device of claim 1, wherein the signal distributor is further configured to maintain a phase relationship between each of the plurality of intermediate driver signals and an output signal from each of the plurality of output transistors.

8. The device of claim 1, wherein the signal distributor comprises:

at least one level shifter configured to generate a level shifter version of the input signal as a one of the plurality of intermediate driver signals; and at least one inverter configured to invert at least one of the plurality of intermediate driver signals to maintain a phase relationship with a corresponding output transistor.

9. The device of claim 1, wherein the signal distributor comprises:

a drive transistor having a base coupled to the input and a collector configured to provide a first intermediate driver signal;

a bias resistor having one end coupled to the collector of the drive transistor and an opposite end coupled to a voltage source; and a level shifter coupled to the input and configured to provide a second intermediate driver signal.

10. The device of claim 9, further comprising a capacitor coupled in parallel with the bias resistor and configured to substantially equalize a delay through a signal path that passes through the drive transistor with a signal path that passes through the level shifter.

11. The device of claim 9, wherein the level shifter comprises at least one emitter follower stage.

12. The device of claim 1, wherein the integrated circuit device comprises an optical modulation driver.

13. The device of claim 1, wherein the plurality of output transistors comprise a plurality of BJT output transistors.

14. The device of claim 1, wherein the plurality of output transistors comprise a plurality of FET output transistors.

15. An integrated circuit device, the device comprising:

a device input configured to receive a signal having a data rate that exceeds 9 Giga symbols per second;

a drive transistor having a base coupled to the device input and configured to generate a first intermediate driver signal at a collector;

a bias resistor configured to couple the collector of the drive transistor to a first voltage source;

a capacitor coupled in parallel with the bias resistor and configured to delay a signal path through the drive transistor;

a level shifter coupled to the device input and configured to generate a level shifted version of the input signal as a second intermediate driver signal;

a first output transistor having a base coupled to the collector of the drive transistor and a collector coupled to a device output and configured to provide an output signal having a voltage swing that exceeds a breakdown voltage of any transistor within the device;

a load resistor configured to couple the collector of the first output transistor to a second voltage source; and a second output transistor having a base coupled to the level shifter and a collector coupled to an emitter of the first output transistor.

16. A method of producing a drive signal, the method comprising:

receiving an input signal having a data rate that is greater than 5 Giga symbols per second;

level shifting the input signal to produce a plurality of level shifted signals;

generating a plurality of intermediate driver signals from the plurality of level shifted signals;

coupling each of the plurality of intermediate driver signals to a corresponding one of a plurality of output transistors, wherein the plurality of output transistors are arranged in a stacked configuration; and providing an output signal from the plurality of output transistors, the output signal having a voltage swing that exceeds a breakdown voltage of any one of the plurality of output transistors.

17. The method of claim 16, further comprising substantially equalizing a signal delay through each of the signal paths passing through at least one of the plurality of output transistors.

18. The method of claim 16, wherein level shifting the input signal comprises buffering the input signal through at least one emitter follower stage.

19. The method of claim 16, wherein generating the plurality of intermediate driver signals comprises synchronizing a phase of each of the plurality of driver signals with a phase of a signal at a collector of a corresponding output transistor from the plurality of output transistors.

20. The method of claim 1, wherein coupling each of the plurality of intermediate driver signals to the corresponding one of the plurality of output transistors comprises coupling each of the plurality of intermediate driver signals to a base of the corresponding one of the plurality of output transistors.

21. The method of claim 16, wherein providing the output signal from the plurality of output transistors comprises providing a portion of the output signal from each of the plurality of output transistors.

22. The method of claim 16, wherein providing the output signal from the plurality of output transistors comprises providing a substantially equal portion of the output signal from each of the plurality of output transistors.

23. The method of claim 16, wherein the plurality of level shifted signals includes a substantially zero shifted signal.

* * * * *